(12) United States Patent
Chen et al.

(10) Patent No.: US 10,283,386 B2
(45) Date of Patent: May 7, 2019

(54) PROCESSING ROOM

(71) Applicant: Shenzhen Jingjiang Yunchuang Technology, Co., Ltd., Shenzhen (CN)

(72) Inventors: Tang-Quan Chen, Shenzhen (CN); Kai Luo, Shenzhen (CN); Xiao-Bo Yuan, Shenzhen (CN); Yi-Min Jiang, Shenzhen (CN)

(73) Assignee: Shenzhen Jingjiang Yunchuang Technology, Co., Ltd., Shenzhen (CN)

( * ) Notice: Subject to any disclaimer, the term of this patent is extended or adjusted under 35 U.S.C. 154(b) by 916 days.

(21) Appl. No.: 14/522,059

(22) Filed: Oct. 23, 2014

(65) Prior Publication Data

US 2015/0184886 A1    Jul. 2, 2015

(30) Foreign Application Priority Data

Dec. 30, 2013 (CN) .......................... 2013 1 0740516

(51) Int. Cl.
*F24F 13/10* (2006.01)
*H01L 21/67* (2006.01)

(52) U.S. Cl.
CPC .............................. *H01L 21/67126* (2013.01)

(58) Field of Classification Search
CPC ....................... H01L 21/67126; H01L 21/6719
See application file for complete search history.

(56) References Cited

U.S. PATENT DOCUMENTS

| 4,563,240 | A * | 1/1986 | Shibata | H01J 37/32082 |
| | | | | 156/345.31 |
| 4,955,244 | A * | 9/1990 | Katahira | B08B 15/00 |
| | | | | 384/15 |
| 6,270,647 | B1 * | 8/2001 | Graham | C25D 7/12 |
| | | | | 204/224 R |
| 6,547,660 | B1 * | 4/2003 | Suenaga | H01L 21/67098 |
| | | | | 414/935 |
| 6,846,380 | B2 * | 1/2005 | Dickinson | B08B 3/04 |
| | | | | 118/719 |
| 9,121,515 | B2 * | 9/2015 | Yamamoto | F16K 51/02 |
| 2004/0177927 | A1 * | 9/2004 | Kikuchi | H01J 37/32174 |
| | | | | 156/345.51 |
| 2007/0181255 | A1 * | 8/2007 | Hayasaka | C23C 16/455 |
| | | | | 156/345.33 |
| 2009/0264049 | A1 * | 10/2009 | Chen | B08B 15/04 |
| | | | | 451/28 |

(Continued)

*Primary Examiner* — Gregory L Huson
*Assistant Examiner* — Ryan L Faulkner
(74) *Attorney, Agent, or Firm* — ScienBiziP, P.C.

(57) ABSTRACT

A processing room includes a processing chamber, a discharge chamber, a sealing member, a blocking member, and a reclaiming member. The discharge chamber includes a main body communicating with the processing chamber, and a receiving portion and a discharge portion communicating with the main body. The receiving portion is aligned to the discharge portion. The sealing member includes a sealing portion and a sealing valve mounted on the sealing portion. The sealing portion is partially and moveably received in the receiving portion and resists against a sidewall of the receiving portion. The blocking member is detachably mounted on an end of the discharge portion and seals the discharge portion. The reclaiming member is partially received in the main body.

17 Claims, 2 Drawing Sheets

(56) References Cited

U.S. PATENT DOCUMENTS

| | | | | |
|---|---|---|---|---|
| 2011/0261333 A1* | 10/2011 | Yamaguchi | ......... | G03F 7/70883 |
| | | | | 355/30 |
| 2012/0000607 A1* | 1/2012 | Ito | ..................... | C23C 16/45561 |
| | | | | 156/345.26 |
| 2014/0145390 A1* | 5/2014 | Mitsuoka | ................. | B23H 7/02 |
| | | | | 269/287 |
| 2014/0295667 A1* | 10/2014 | Kaga | ....................... | C23C 16/34 |
| | | | | 438/680 |

* cited by examiner

PROCESSING ROOM

FIELD

The present disclosure relates to processing rooms, particularly to a processing room having an inert atmosphere.

BACKGROUND

Workpieces which oxidize easily should be processed in an anaerobic and hermetical environment. A processing room for receiving the easily oxidized workpieces can include a processing chamber and a pump for vacuumizing the processing chamber.

BRIEF DESCRIPTION OF THE DRAWINGS

Implementations of the present technology will now be described, by way of example only, with reference to the attached figures.

DETAILED DESCRIPTION

Figure 1:
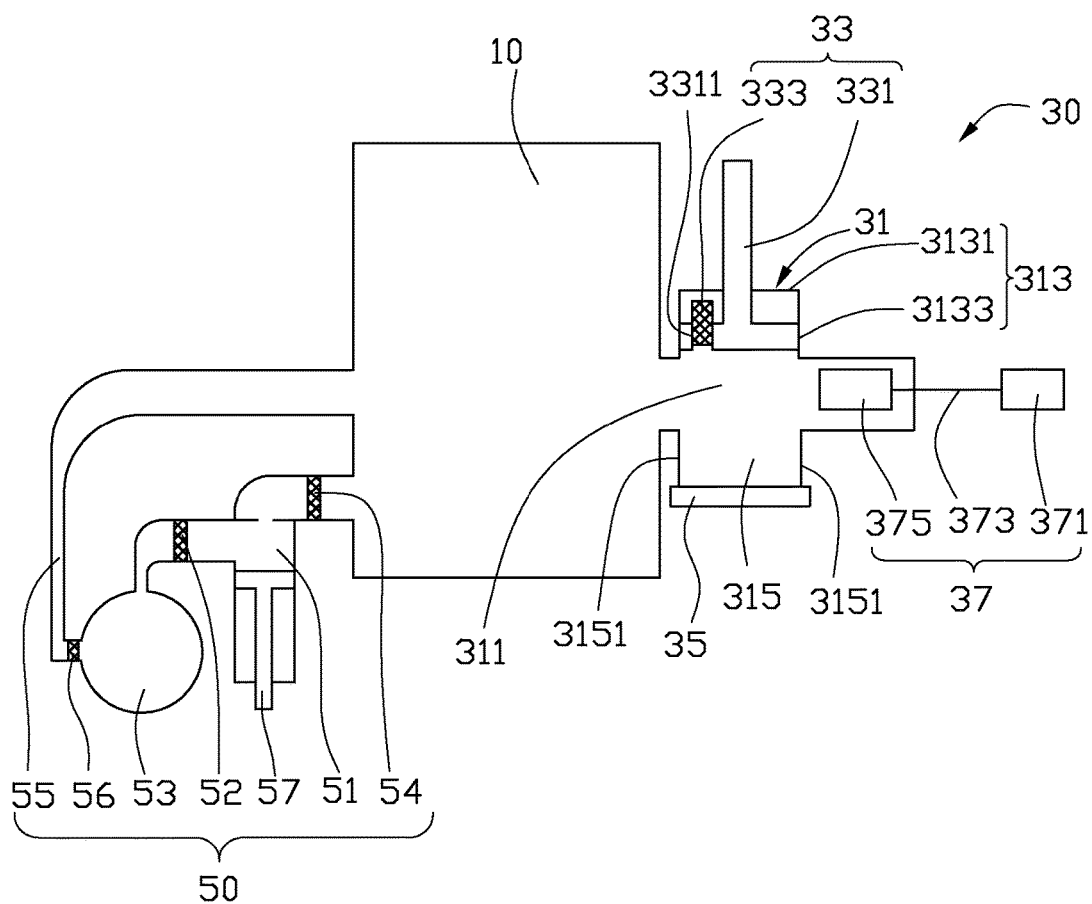
FIG. 1 is a diagrammatic view of an embodiment of a processing room in a first status.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "outside" refers to a region that is beyond the outermost confines of a physical object. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "comprising," when utilized, means "including, but not necessarily limited to"; it specifically indicates open-ended inclusion or membership in the so-described combination, group, series and the like.

The present disclosure is described in relation to a processing room having an inert atmosphere during processing of workpieces. The processing chamber can include a processing chamber, a gas storage chamber, a discharge chamber, a sealing member, a blocking member, and a reclaiming member. The gas storage chamber can alternatively communicate with the processing chamber. The discharge chamber can include a main body communicating with the processing chamber, a receiving portion communicating with the main body, and a discharge portion aligned to the receiving portion and communicating with the main body. The sealing member can include a sealing portion and a sealing valve mounted on the sealing portion. The sealing portion can be partially and movably received in the receiving portion and resist against a sidewall of the receiving portion. The blocking member can be detachably mounted on an end of the discharge portion away from the receiving portion to seal the discharge portion. The reclaiming member can be partially received in the main body. The reclaiming member can be configured to move into the processing chamber to move the processed workpiece to a top of the discharge portion. The sealing portion can be configured to seal the discharge portion when the processed workpiece is being removed.

The present disclosure is described in relation to a processing room having an inert atmosphere during processing of workpieces. The processing room can include a processing chamber, a gas storage chamber, a discharge chamber, a sealing member, a blocking member, and a reclaiming member. The gas storage chamber can be in selective fluid communication with the processing chamber. The discharge chamber can include a main body in fluid communication with the processing chamber, a receiving portion positioned on a first side of the main body, and a discharge portion positioned on a second of the main body. The discharge portion can be in fluid communication with the main body. The sealing member can include a sealing portion partially and movably received in the receiving portion and a sealing valve mounted on the sealing portion. The sealing portion can resist against a sidewall of the receiving portion. The blocking member can be detachably mounted to the discharge portion. The blocking member can be provided at an end of the discharge portion away from the receiving portion to seal the discharge portion. The reclaiming member can be partially received in the main body. The reclaiming member can be configured to enter the processing chamber to move processed workpieces into the discharge portion. The sealing portion can be configured to move to the discharge portion to seal the discharge portion when the processed workpieces are removed therefrom.

FIG. 1 illustrates an embodiment of a processing room 100. The processing room 100 can include a processing chamber 10, a reclaiming device 30, and a gas storage device 50. The processing chamber 10, the reclaiming device 30, and the gas storage device 50 cooperatively define a hermetical processing environment. The processing chamber 10 can be configured to process workpieces (not shown in FIG. 1), such as plating, incising, and so on. The reclaiming device 30 can communicate with the processing chamber 10 and be configured to remove processed workpieces from the processing chamber 10. The gas storage device 50 can communicate with the processing chamber 10. The gas storage device 50 can be configured to provide gas to the processing chamber 10 and recycle the gas in the processing chamber 10.

The reclaiming device 30 can include a discharge chamber 31, a sealing member 33, a blocking member 35, and a reclaiming member 37. The discharge chamber 31 can be located at a side of the processing chamber 10 and communicate with the processing chamber 10. The discharge chamber 31 can include a main body 311, a receiving portion 313, and a discharge portion 315 aligned to the receiving portion 313. The main body 311 can be substantially hollow and cylindrical. The main body 311 can protrude out from the side of the processing chamber 10 and communicate with the processing chamber 10. The receiving portion 313 can be substantially hollow and cylindrical and can protrude out from a side of the main body 311 communicating with the main body 311. The receiving portion 313 can include an end wall 3131 and a first sidewall 3133 substantially perpendicularly extending from an edge of the end wall 3131 towards the main body 311. The first sidewall 3133 can be substantially cylindrical shape. The discharge portion 315 can be substantially hollow and cylindrical and can protrude out from the side of the main body 311 away from the receiving portion 313 communicating with the main body 311. The discharge portion 315 can include a second sidewall 3151. The second sidewall 3151 can be substantially cylindrical shape. An imaginary extension line of the second sidewall 3151 can coincide with an imaginary extension line of the first sidewall 3131.

The sealing member 33 can include a sealing portion 331 and a sealing valve 333. A first end portion of the sealing portion 331 can movably pass through the end wall 3131 and partially protrude out from the receiving portion 313. The sealing portion 331 can be coupled with a driving member (not shown) to drive the sealing portion 331. A second end portion of the sealing portion 331 can be movably received in the receiving portion 313 and resist against the first sidewall 3133. The sealing portion 331 can slide into the main body 311 and the discharge portion 315 along the first sidewall 3133. When the sealing portion 331 slides into the discharge portion 315, the sealing portion 311 can resist against the second sidewall 3151 of the discharge portion 315. The sealing portion 331 can define a hole 3311 communicating with the main body 311. The sealing valve 333 can be received in the hole 3311 and seal the hole 3311.

The blocking member 35 can be detachably mounted on an end of the second sidewall 3151 away from the receiving portion 313 and seal the discharge portion 315. The reclaiming member 37 can include a driving portion 371, a coupling portion 373, and a reclaiming portion 375. The driving portion 371 can be located adjacent to the main body 311. A first end portion of the coupling portion 373 can be coupled to the driving portion 371. A second end portion of the coupling portion 373 can extend into the main body 311 and be coupled to the reclaiming portion 375. The coupling portion 373 can move relative to the main body 311 without breaking the hermetization of the main body 311. The reclaiming portion 375 can be received in the main body 311. The driving portion 371 can drive the reclaiming portion 375 to enter the processing chamber 10 to remove the processed workpieces. At least one embodiment, the sealing portion 331 can be a sealing piston.

The gas storage device 50 can include a pressurized chamber 51, a first valve 52, a gas storage chamber 53, a second valve 54, a passage 55, a communicating valve 56, and a pressing member 57. The pressurized chamber 51 can be located at a side of the processing chamber 10 and alternatively communicate with the processing chamber 10 via the second valve 54. The gas storage chamber 53 can be located at a side of the pressurized chamber 51 and alternatively communicate with the pressurized chamber 51 via the first valve 52. The gas storage chamber 53 can be configured to store inert gas. The passage 55 can be configured to communicate between the gas storage chamber 53 and the processing chamber 10. The communicating valve 56 can be mounted on the gas storage chamber 53 to allow the gas storage chamber 53 to alternatively communicate between the processing chamber 10 and the gas storage chamber 53 via the passage 55. The pressing member 57 can be movably received in the pressurized chamber 51 and partially protrude out from the pressurized chamber 51. The pressing member 57 can be configured to press the gas stored in the pressurized chamber 51. At least one embodiment, the pressing member 57 can be a pressing piston. The first valve 52 and the second valve 54 can be one-way valves. The gas stored in the processing chamber 10 can reflux to the gas storage chamber 53 via the pressurized chamber 51. The communicating valve 56 can be a manual valve.

In assembly, the sealing valve 333 can be received in the hole 3311 and seal the hole 3311. The first end portion of the sealing portion 331 can be movably received in the receiving portion 313 and resist against the first sidewall 3133. The second end portion of the sealing portion 331 can movably pass through the end wall 3131 and protrude out from the receiving portion 313. The end wall 3131 can be mounted on the first sidewall 3133. The first end portion of the coupling portion 373 can be coupled to the driving portion 371. The reclaiming portion 375 can be coupled to the second end of the coupling portion 373 and be received in the main body 311. The blocking member 35 can be located at the second sidewall 3151 and seal the discharge portion 315. The pressurized chamber 51 can alternatively communicate with the processing chamber 10 via the second valve 54. The pressing member 57 can be movably received in the pressurized chamber 51. The gas storage chamber 53 can alternatively communicate with the passage 55 via the communicating valve 56 and communicate with the processing chamber 10 via the passage 55.

Before the workpieces are processed, the blocking member 35 can be opened. Workpieces can be put into the processing chamber 10. The sealing member 33 can be driven to a bottom end of the discharge chamber 315 along the first sidewall 3133, the end wall 3131, and the second sidewall 3151, to seal the discharge chamber 315. The sealing valve 333 and the communicating valve 56 can be closed. The processing chamber 10 can be vacuumized and pre filled with inert gas via a pump. The blocking member 35 can cover the discharge chamber 315 and resist against the sealing portion 331. The sealing portion 331 can be driven into the receiving portion 313. During recovery of the sealing portion 331, the sealing valve 333 can be opened to devacuumize the sealing portion 331 and the blocking member 35. When the sealing portion 331 has been recovered, the sealing valve 333 can be closed, the workpieces can be processed in the processing chamber 10.

Figure 2:
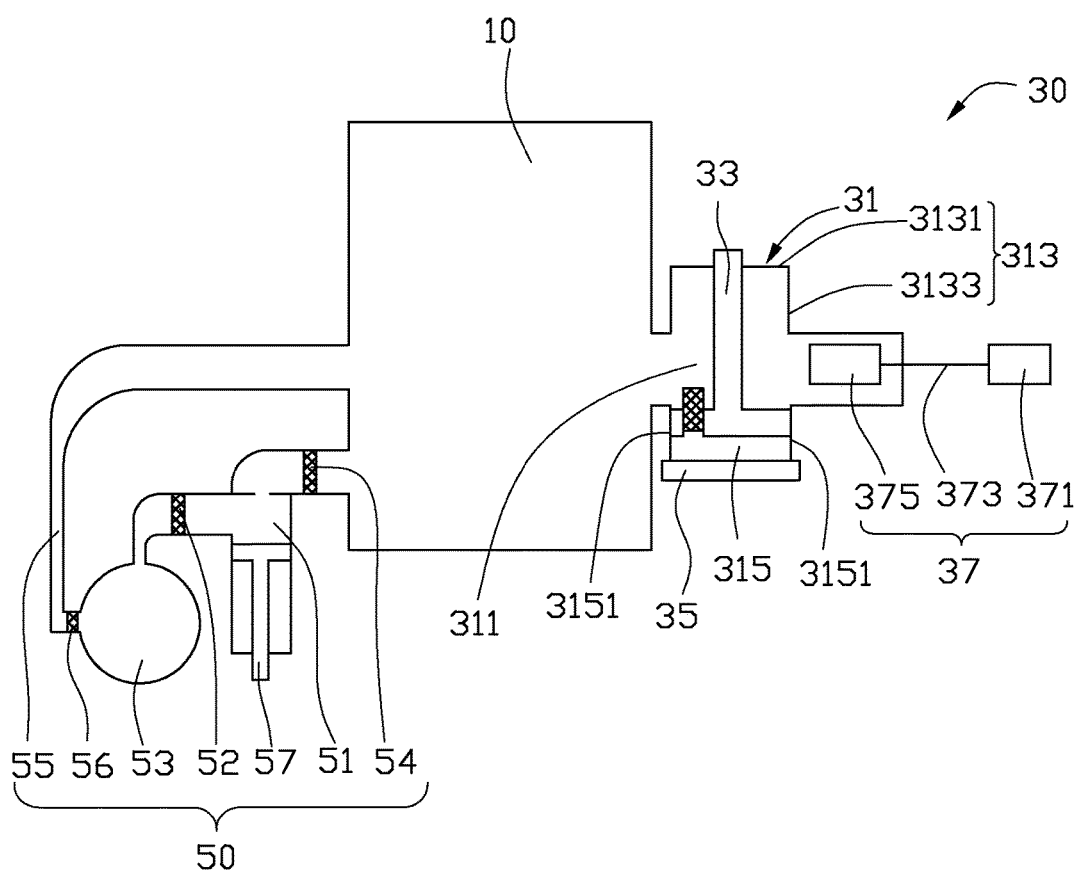
FIG. 2 is a diagrammatic view of an embodiment of a processing room in a second status.

When the workpieces are processed, the driving portion 371 can drive the reclaiming portion 375 to enter the processing chamber 10, thereby moving the workpieces to a top of the discharge portion 315. The reclaiming portion 375 can release the workpieces and the workpieces can be dropped downward to the blocking member 35. The sealing valve 333 can be opened and then the sealing portion 331 can be driven towards the blocking member 35 (shown in FIG. 2). The sealing portion 331 can move until resisting against the workpiece. At the same time, the inert gas in the discharge portion 315 can flow to the main body 311 via the sealing valve 333. Then, the sealing valve 333 can be closed. The blocking member 35 can be opened to the allow the workpieces to be removed. Air outside of the door can enter into the discharge portion 315. After the workpiece is removed, the sealing portion 331 can be driven downward again to push the air out from the discharge portion 315. When the sealing portion 331 arrives at the bottom end of the discharge portion 315 away from the receiving portion 315, the sealing portion 331 can stop movement. Finally, the blocking member 35 can seal the discharging member 315. Then, the sealing portion 331 can be recovered back to the receiving member 313.

During the workpiece being processed, when the barometric pressure in the processing chamber 10 increases to the default value, the second valve 54 can be opened because of the pressure difference. At the same time, the gas in the processing chamber 10 can flow into the pressurized chamber 51 to decrease the barometric pressure in the processing chamber 10. The pressing member 57 can compress the gas to make the second valve 54 close and increase the barometric pressure in the pressurized chamber 51 until greater than the barometric pressure in the gas storage chamber 53. Because of the pressure difference, the second valve 52 can be opened. The gas in the pressurized chamber 51 can flow into the gas storage chamber 53 to be stored. When the barometric pressure in the processing chamber 10 is decreased to the default value, the communicating valve 56 can be opened. The gas in the gas storage chamber 53 can flow into the processing chamber 10 via the passage 55, to balance the barometric pressure in the processing chamber 10.

In an alternative embodiment, the first valve 52 can be a manual valve. When the first valve 52 is a manual valve, the pressurized chamber 51, the second valve 54, the passage 55, and the pressing member 57 can be omitted. The gas storage chamber 53 can alternatively communicate with the processing chamber 10 via the first valve 52 and the communicating valve 56.

It is believed that the present embodiments and their advantages will be understood from the foregoing description, and it will be apparent that various changes can be made thereto without departing from the spirit and scope of the embodiments or sacrificing all of its material advantages.

What is claimed is:

1. A processing room comprising:
a processing chamber;
a gas storage chamber alternatively communicating with the processing chamber;
a discharge chamber comprising:
a main body communicating with the processing chamber,
a receiving portion communicating with the main body, and
a discharge portion aligned to the receiving portion and communicating with the main body;
a sealing member comprising:
a sealing portion partially and movably received in the receiving portion and resisting against a sidewall of the receiving portion, and
a sealing valve mounted on the sealing portion;
a blocking member detachably mounted on an end of the discharge portion away from the receiving portion to hermetically seal the discharge portion; and
a reclaiming member comprising:
a driving portion located adjacent to the main body,
a coupling portion, a first end portion of the coupling portion being coupled to the driving portion, and
a reclaiming portion received in the main body, a second end portion of the coupling portion extending into the main body and being coupled to the reclaiming portion;
wherein the coupling portion can move relative to the main body by the driving portion without breaking the hermetic seal between the discharge portion and the blocking member, the driving portion is configured to drive the reclaiming portion to move a plurality of workpieces into the processing chamber or to enter the processing chamber to move a plurality of processed workpieces to the blocking member;
wherein the blocking member is controlled to open, the plurality of workpieces is put into the processing chamber by the reclaiming portion, the sealing valve is controlled to be closed and the sealing member moves into the discharge portion to seal the discharge chamber, the processing chamber is vacuumized via a pump, and the processing chamber is filled with inert gas from the gas storage chamber, the blocking member covers and seals the discharge chamber, the sealing valve is controlled to open, and the sealing portion moves into the receiving portion again; and
wherein the plurality of processed workpieces is taken to the blocking member by the reclaiming portion, the sealing valve is controlled to open and the sealing portion moves into the discharge portion to seal the discharge portion until resisting against the plurality of processed workpieces, the sealing valve is controlled to be closed and the blocking member is controlled to open to allow the workpieces to be unloaded, the sealing portion moves downward again until resisting against the blocking member to push air out from the discharge portion.

2. The processing room of claim 1, wherein the receiving portion is substantially hollow and cylindrical, the receiving portion comprises:
an end wall, and
a first sidewall extending from an edge of the end wall towards the main body,
wherein the discharge portion is substantially hollow and cylindrical; the discharge portion comprises:
a second sidewall,
an imaginary extension line of the second sidewall coincides with an imaginary extension line of the sidewall, the sealing portion resists against the first sidewall, the sealing portion is configured to slide into the discharge portion along the first sidewall, the end wall, and the second sidewall.

3. The processing room of claim 1, wherein the processing room further comprises:
a first valve, the gas storage chamber alternatively communicates with the processing chamber via the first valve to recycle gas in the processing chamber, and
a communicating valve mounted on the gas storage chamber, the gas storage chamber alternatively communicates with the processing chamber via the communicating valve to provide gas to the processing chamber.

4. The processing room of claim 3, wherein the processing room further comprises:
a pressurized chamber, and
a second valve mounted on the pressurized chamber, the pressurized chamber alternatively communicates with the processing chamber via the second valve and alternatively communicates with the gas storage chamber via the first valve.

5. The processing room of claim 4, wherein the processing chamber further comprises:
a pressing member partially and moveably received in the pressurized chamber, the pressing member is configured to press the gas stored in the pressurized chamber to make it flow into the gas storage chamber.

6. The processing room of claim 3, wherein the processing room further comprises:
   a passage communicating with the processing chamber and alternatively communicating with the gas storage chamber via the communicating valve.

7. The processing room of claim 1, wherein the sealing portion defines a hole, the sealing valve is received in the hole and seals the hole.

8. A processing room comprising:
   a processing chamber;
   a discharge chamber comprising:
      a main body communicating with the processing chamber,
      a receiving portion communicating with the main body, and
      a discharge portion aligned to the receiving portion and communicating with the main body;
   a sealing member comprising:
      a sealing portion partially and movably received in the receiving portion and resisting against the sidewall of the receiving portion, and
      a sealing valve mounted on the sealing portion;
   a blocking member detachably mounted on an end of the discharge portion away from the receiving portion to hermetically seal the discharge portion; and
   a reclaiming member comprising:
      a driving portion located adjacent to the main body,
      a coupling portion, a first end portion of the coupling portion being coupled to the driving portion, and
      a reclaiming portion received in the main body, a second end portion of the coupling portion extending into the main body and being coupled to the reclaiming portion;
   wherein the coupling portion can move relative to the main body by the driving portion without breaking the hermetic seal between the discharge portion and the blocking member, the driving portion is configured to drive the reclaiming portion to move a plurality of workpieces into the processing chamber or enter the processing chamber to move a plurality of processed workpieces to the blocking member;
   wherein the blocking member is controlled to open, the plurality of workpieces is put into the processing chamber by the reclaiming portion, the sealing valve is controlled to be closed and the sealing member moves into the discharge portion to seal the discharge chamber, the processing chamber is vacuumized via a pump, and the processing chamber is filled with inert gas, the blocking member covers and seals the discharge chamber, the sealing valve is controlled to open, and the sealing portion moves into the receiving portion again; and
   wherein the plurality of processed workpieces is taken to the blocking member by the reclaiming portion, the sealing valve is controlled to open and the sealing portion moves into the discharge portion to seal the discharge portion until resisting against the plurality of processed workpieces, the sealing valve is controlled to be closed and the blocking member is controlled to open to allow the workpieces to be unloaded, the sealing portion moves downward again until resisting against the blocking member to push air out from the discharge portion.

9. The processing room of claim 8, wherein the processing room further comprises a gas storage device alternatively communicating with the processing chamber, the gas storage device is configured to provide gas to the processing chamber and recycle the gas in the processing chamber.

10. The processing room of claim 9, wherein the gas storage device comprises:
    a first valve,
    a gas storage chamber alternatively communicating with the processing chamber via the first value to recycle gas in the processing chamber, and
    a communicating valve mounted on the gas storage chamber, the gas storage chamber alternatively communicates with the processing chamber via the communicating valve to provide gas to the processing chamber.

11. The processing room of claim 10, wherein the gas storage device further comprises:
    a pressurized chamber, and
    a second valve mounted on the pressurized chamber, the pressurized chamber alternatively communicates with the processing chamber via the second valve and alternatively communicates with the gas storage chamber via the first valve.

12. The processing room of claim 11, wherein the gas storage device further comprises:
    a pressing member partially and moveably received in the pressurized chamber, the pressing member is configured to press the gas storing in the pressurized chamber to make it enter into the gas storage chamber.

13. The processing room of claim 12, wherein the gas storage device further comprises:
    a passage communicating with the processing chamber and alternatively communicating with the gas storage chamber via the communicating valve.

14. The processing room of claim 8, wherein the receiving portion is substantially hollow and cylindrical, the receiving portion comprises:
    an end wall, and
    a first sidewall extending from an edge of the end wall towards the main body,
    wherein the discharge portion is substantially hollow and cylindrical, the discharge portion comprises:
    a second sidewall,
    an imaginary extension line of the second sidewall coincides with an imaginary extension line of the sidewall, the sealing portion resists against the first sidewall, the sealing portion is configured to slide into the discharge portion along the first sidewall, the end wall, and the second sidewall.

15. A processing room, comprising:
    a processing chamber;
    a gas storage chamber in selective fluid communication with the processing chamber;
    a discharge chamber comprising:
       a main body in fluid communication with the processing chamber,
       a receiving portion positioned on a first side of the main body, the receiving portion being in fluid communication with the main body, and
       a discharge portion positioned on a second side of the main body, the discharge portion being in fluid communication with the main body;
    a sealing member comprising:
       a sealing portion that is partially and movably received in the receiving portion, the sealing portion resisting against a sidewall of the receiving portion, and
       a sealing valve mounted on the sealing portion;
    a blocking member detachably mounted to the discharge portion, the blocking member being provided at an end of the discharge portion away from the receiving portion to hermetically seal the discharge portion; and a reclaiming member comprising:
  a driving portion located adjacent to the main body,
  a coupling portion, a first end portion of the coupling portion being coupled to the driving portion, and
  a reclaiming portion received in the main body, a second end portion of the coupling portion extending into the main body and being coupled to the reclaiming portion;

wherein the coupling portion can move relative to the main body by the driving portion without breaking the hermetic seal between the discharge portion and the blocking member, the driving portion is configured to drive the reclaiming portion to move a plurality of workpieces into the processing chamber or enter the processing chamber to move a plurality of processed workpieces to the blocking member;

wherein the blocking member is controlled to open, the plurality of workpieces is put into the processing chamber by the reclaiming portion, the sealing valve is controlled to be closed and the sealing member moves into the discharge portion to seal the discharge chamber, the processing chamber is vacuumized via a pump, and the processing chamber is filled with inert gas from the gas storage chamber, the blocking member covers and seals the discharge chamber, the sealing valve is controlled to open, and the sealing portion moves into the receiving portion again; and wherein the plurality of processed workpieces is taken to the blocking member by the reclaiming portion, the sealing valve is controlled to open and the sealing portion moves into the discharge portion to seal the discharge portion until resisting against the plurality of processed workpieces, the sealing valve is controlled to be closed and the blocking member is controlled to open to allow the workpieces to be unloaded, the sealing portion moves downward again until resisting against the blocking member to push air out from the discharge portion.

16. The processing room of amended claim 15, wherein the receiving portion is substantially hollow and cylindrical, the receiving portion comprises:
  an end wall, and
  a first sidewall extending from an edge of the end wall towards the main body,
  wherein the discharge portion is substantially hollow and cylindrical; the discharge portion comprises:
  a second sidewall,
  an imaginary extension line of the second sidewall coincides with an imaginary extension line of the sidewall, the sealing portion resists against the first sidewall, the sealing portion is configured to slide into the discharge portion along the first sidewall, the end wall, and the second sidewall.

17. The processing room of amended claim 15, wherein the processing room further comprises:
  a first valve, the gas storage chamber alternatively communicates with the processing chamber via the first valve to recycle gas in the processing chamber, and
  a communicating valve mounted on the gas storage chamber, the gas storage chamber alternatively communicates with the processing chamber via the communicating valve to provide gas to the processing chamber.

* * * * *